United States Patent [19]

Suzuki

[11] 4,406,546
[45] Sep. 27, 1983

[54] PHOTOELECTRIC DETECTING DEVICE

[75] Inventor: Akiyoshi Suzuki, Tokyo, Japan

[73] Assignee: Canon Kabushiki Kaisha, Tokyo, Japan

[21] Appl. No.: 173,889

[22] Filed: Jul. 31, 1980

[30] Foreign Application Priority Data

Aug. 6, 1979 [JP] Japan ................... 54-100039

[51] Int. Cl.³ .................................... G01B 11/00
[52] U.S. Cl. ................................. 356/400
[58] Field of Search ................ 356/400–401; 350/81; 250/548, 557

[56] References Cited
U.S. PATENT DOCUMENTS

| | | | |
|---|---|---|---|
| 3,853,398 | 12/1974 | Kano | 350/81 |
| 3,865,483 | 2/1975 | Wojcik | 250/548 |
| 4,153,371 | 5/1979 | Koizumi et al. | 350/81 |
| 4,251,129 | 2/1981 | Suzki et al. | 350/91 |
| 4,315,201 | 2/1982 | Suzki et al. | 356/401 |

*Primary Examiner*—William H. Ponter
*Attorney, Agent, or Firm*—Fitzpatrick, Cella, Harper & Scinto

[57] ABSTRACT

A photoelectric detecting device reads the alignment mark of a mask and the alignment mark of a wafer with high accuracy. In this device, a photoelectric detecting system for detecting the light reflected from the mask and a photoelectric detecting system for detecting the light reflected from the wafer are provided separately from each other to read the two marks with high accuracy. To distinguish between the light reflected from the mask and the light reflected from the wafer, a λ/4 plate is positioned between the mask and the wafer. The device also uses a polarized light beam to illuminate the mask and wafer.

3 Claims, 9 Drawing Figures

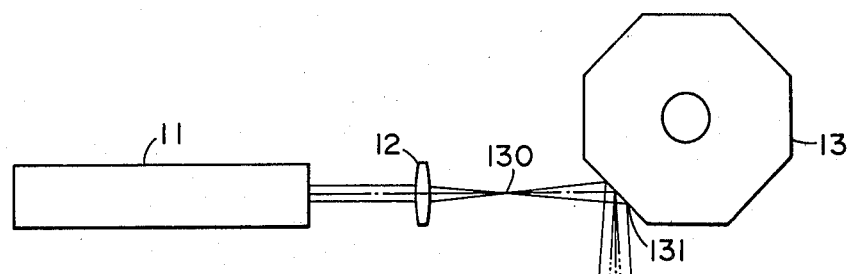
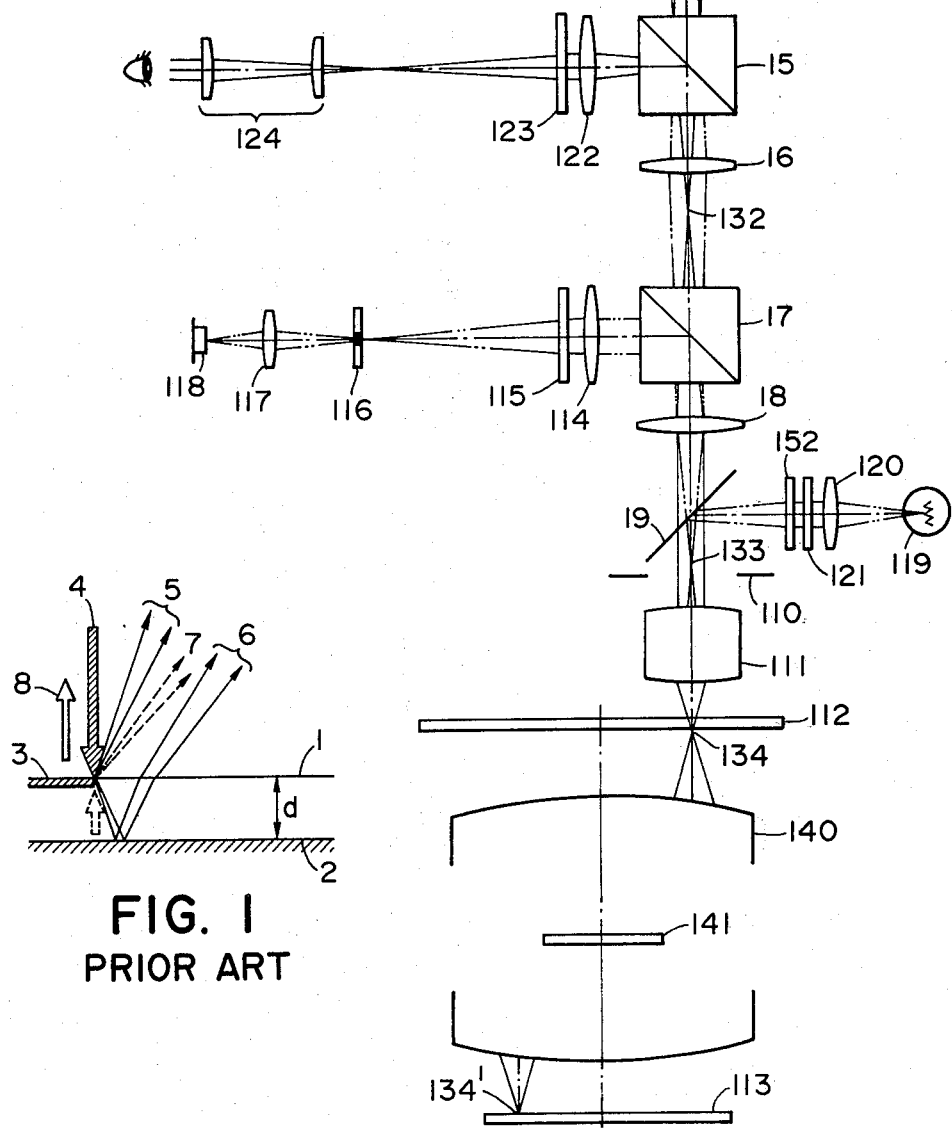
FIG. 2
PRIOR ART
FIG. 1
PRIOR ART

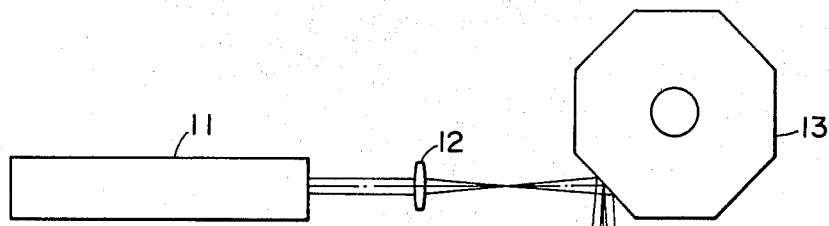
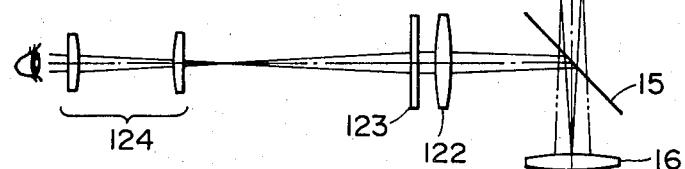
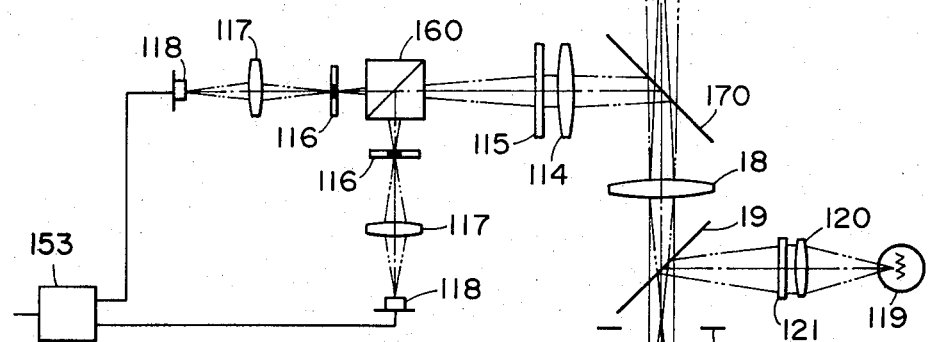
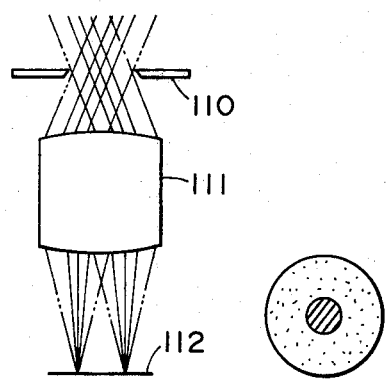
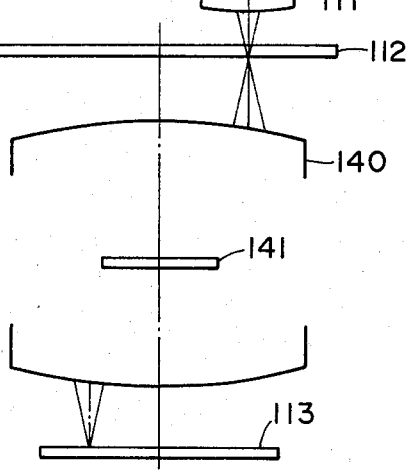
FIG. 4 PRIOR ART
FIG. 3a PRIOR ART    FIG. 3b PRIOR ART

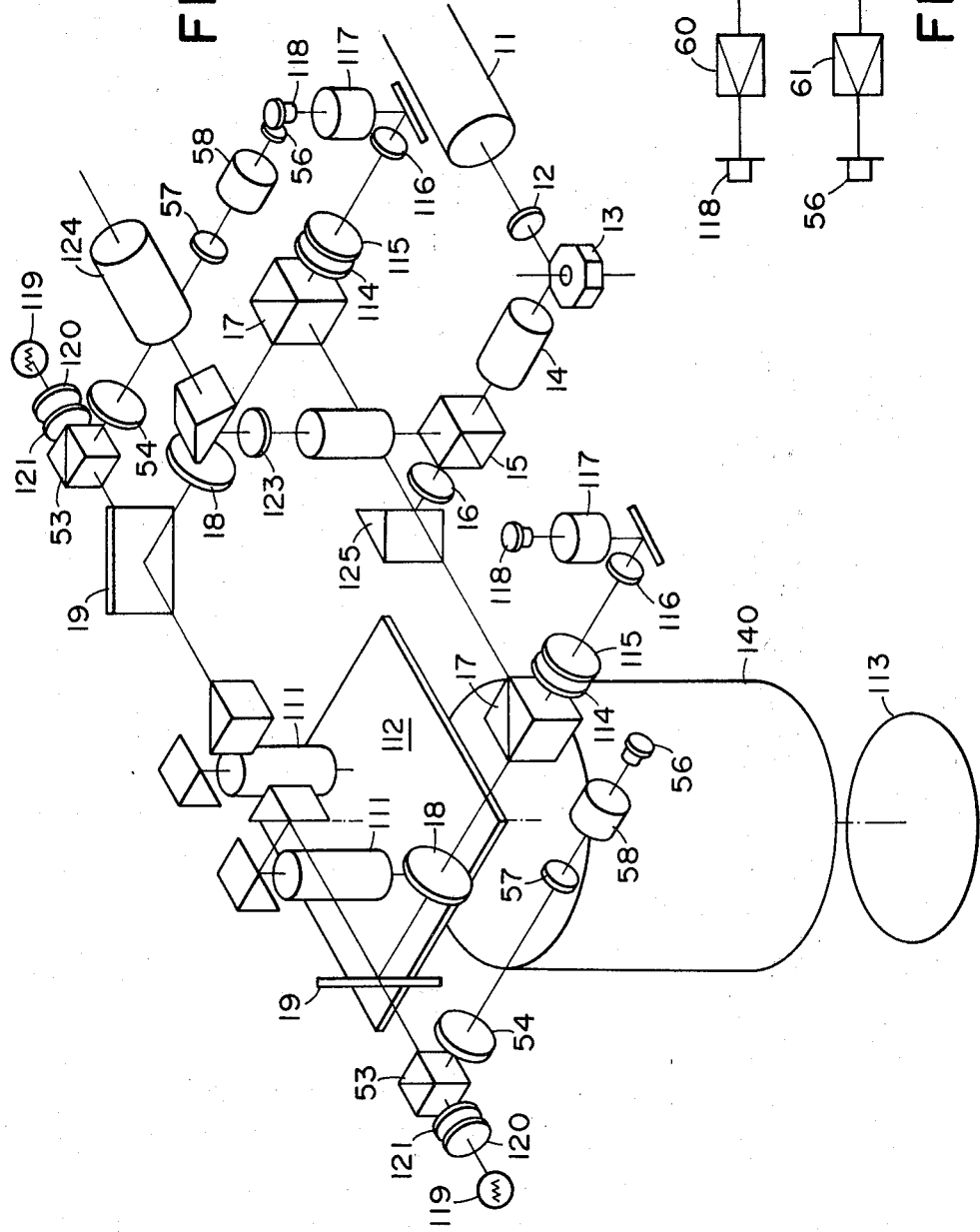
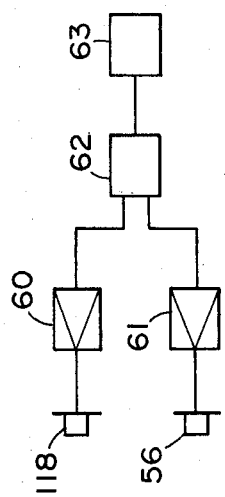
FIG. 7
FIG. 8

PHOTOELECTRIC DETECTING DEVICE

BACKGROUND OF THE INVENTION

1. Field of the Invention

This invention relates to a photoelectric detecting device, and more particularly to a photoelectric detecting device which reads the pattern of a first pattern carrier such as a mask used during the manufacture of semiconductor circuit elements and the pattern of a second pattern carrier such as a wafer to detect the mutual positional relationship between the two patterns.

2. Description of the Prior Art

Applicant filed an application covering a scanning type light detecting device which scans a mask and a wafer with a laser spot and reads the alignment mark of the mask and the alignment mark of the wafer in a dark view field. This application has been registered as U.S. Pat. No. 4,199,219. As an improvement over this U.S. Pat. No. 4,199,219, applicant filed U.S. application Ser. No. 948,776 on Oct. 5, 1978 which issued as U.S. Pat. No. 4,251,129 on Feb. 17, 1981. The improvement of this U.S. Pat. No. 4,251,129 lies in that the influence of the interference between the light reflected by the mask and the light reflected by the wafer is eliminated. The device of this patent will hereinafter be described with reference to the accompanying drawings.

In FIG. 1, reference numeral 1 designates a mask and reference numeral 2 denotes a wafer. A pattern 3 is formed on the mask 1. The pattern 3 is usually formed of Cr, chrome oxide ($Cr_xO_y$), Si or the like. When a laser light 4 is applied to the mask, scattered light is created from the edge of the pattern. Major parts of this scattered light are indicated at 5, 6 and 7 in FIG. 1. Reference numeral 8 designates a non-scattered light reflected from the mask pattern, reference numeral 5 designates the light directly scattered and returned from the mask, reference numeral 6 denotes the scattered light scattered by the mask 3 and thereafter reflected by the wafer, and reference numeral 7 denotes the light passed through the mask 3 without being scattered, and reflected by the wafer and then scattered by the mask pattern 3.

When these lights are caught by the photoelectric detecting system of U.S. Pat. No. 4,199,219, the scattered light 5 and the scattered lights 7, 6 cause an interference phenomenon. The state of interference is determined by the distance d between the mask and the wafer. However, since the mask and the wafer are not strictly parallel to each other, d varies depending on the place and since d may vary from time to time by several tenths of a micron because of the thermal stability of the holding mechanisms for the mask and the wafer during the alignment operation, the mask signal may fluctuate with time and this has caused the measured value to be irregular.

Such disadvantage has been overcome by the photoelectric detecting device of U.S. Pat. No. 4,251,129, the outline of which will hereinafter be described with reference to FIGS. 2 and 3.

FIG. 2 shows the optical arrangement of the photoelectric detector device according to said U.S. Pat. No. 4,251,129. Designated by 11 is an He-Ne gas laser. The direction of polarization of the light from the laser 11 lies in the plane of the drawing sheet. Such light is referred to as the P polarized light. FIG. 2 further includes a condenser lens 12, a rotatable polygonal mirror 13, a relay lens 14, and a dichroic mirror 15 for directing light to an observation optical system 122, 123, 124. The dichroic mirror 15 transmits therethrough the light from the laser 11. FIG. 2 further includes a field lens 16, and a polarizing splitter 17 for directing light to a photoelectric detecting system 114, 115, 116, 117, 118. The splitter 17 transmits therethrough the P polarized light. FIG. 2 also includes a relay lens 18, a beam splitter 19 for directing the light from an observation illuminating optical system 119, 120, 121, 152, to an objective lens 111 having a pupil 110, a mask 112, a wafer 113, a lens 140 for forming the image of the mask 112 on the wafer 113, and a λ/4 plate 141. These members together constitute an optical system for laser beam scanning.

In the scanning optical system of FIG. 2, the relation of the formed image of the scanning spot is as follows: In FIG. 2, 134 and 134' are places scanned, and if the light path is traced back from 134' toward the rotatable polygon mirror 13, the spot 134' is focused at a position 132 near the field lens 16 through the projection lens 140, the objective lens 111 and the relay lens 18, and again focused at a position 130 after being reflected by the rotatable mirror through the relay lens 14. Thus, the positions 130, 132, 134 and 134' are in conjugate relationship with one another. Therefore, if the diameter of the laser spot to the position 130 is $\phi$ and the focusing magnification from the position 130 to the position 134 is $\beta$, the diameter of the scanning spot at the position 134 is represented by $\beta\phi$.

The focusing relationship of the pupil of the optical system of FIG. 2 is as important as the conjugate relationship of the scanning beam on the surface of the actual object as described above. The pupil of the objective lens is indicated at 110 in the Figure, and a point 133 on the optic axis which is the central point of the pupil 110 and the reflecting point 131 on the rotatable polygon mirror 13 are conjugate with each other. Thus, if viewed from the viewpoint of the entry of the laser beam into the objective lens 111, the arrangement of FIG. 2 may be said to be equivalent to a case where the rotatable mirror 13 is placed at the position of the pupil 110.

To understand the optical system of FIG. 2, one must understand the action of the objective lens 111. FIG. 3 shows the principle of the action of the objective lens used. According to the device shown in FIG. 2, the objective lens 111 is telecentrically disposed. A telecentric objective lens refers to a lens in which the position 110 of the pupil which is the place determining the size of the light passed through the objective lens, is coincident with the focal plane. The light ray passed through the center of the pupil 110 provides the central ray of the light beam and so, it is called the principal ray. Since the center of the pupil is the focus of the objective lens, the principal ray becomes parallel to the optic axis of the objective lens after passed through the objective lens, and enters the surface 112 of the object perpendicularly thereto. When impinging on the portion of the object which effects mirror reflection, the light ray having entered perpendicularly returns on the same path that it has followed, and passes through the objective lens to come back to the central position of the pupil. On the other hand, if the portion on which the light impinges has a pattern thereon, the light is scattered at the portion of the borderline forming the pattern. If the portion of the borderline is generically referred to as the edge, the light scattered by the edge does not return on the same light path that it has followed, unlike the mirror surface reflection. Therefore, when passing through the pupil by being again caught by the objective lens, the scattered light no longer passes through the center of the pupil. This shows that when the reflected light passed through the objective lens is observed on the pupil, the component reflected by the mirror surface and the scattered light component are spatially separated from each other in the pupil. FIG. 3 illustrates the manner of such separation. The mirror surface reflected component entering the pupil and passing through the objective lens and again passing through the pupil is indicated by hatching in FIG. 3b, and the scattered light which can be caught by the objective lens is indicated by dots. The diameter of the light beam effective for the mirror surface reflecting portion is normally selected to a sufficiently small value with respect to the diameter of the pupil to enable the scattered light to be effectively caught, and the diameter ratio may desirably be within the range in the vicinity of 0.1 to 0.7.

Turn back to FIG. 2 to consider the photoelectric detecting optical system leading from the polarization splitter 17 to a photodetector 118. Denoted by 114 is a lens for imaging the pupil 110 of the objective lens 111, and 115 is a filter for passing therethrough the light for photoelectric detection and for substantially intercepting the other wavelengths, for example, the light of the wavelength range used with a visually observing optical system. The position 116 is the place whereat the image of the pupil 110 is formed by the lens 114 for imaging the pupil. Disposed here is an optical filter 116 for passing therethrough only the scattered light and for blocking the non-scattered light. The scattered light passed through the filter 116 is collected onto the photodetector 118 by a condenser lens 117. Therefore, the pupil 110, the filter 116 and the photodetector 118 are in conjugate relationship with one another. The filter may be easily prepared as by patterning a transparent glass substrate by the use of metal or Chinese ink. Accordingly, the photodetector system for detecting the scattered light puts out an output only when the scanning post comes to the edge portion of the pattern. Assuming that the pattern is the alignment marks indicated on the mask and the wafer, respectively, the deviation of the relative position of the mask and the wafer can be detected from the output signal. The relation between the two may be corrected by an unshown driving system in accordance with the detected amount of deviation, thereby effecting auto-alignment.

FIG. 2 further includes an illuminating system 119, 120, 121, 152 and an observation system 122, 123, 124. In the illuminating system, reference numeral 119 designates a mercury lamp, and 120 a condenser lens for forming the image of a light source on the pupil 110 of the objective lens 111 and serving to effect so-called Koehler illumination. Designated by 121 is a filter which passes therethrough the wavelength of the non-sensitive range (1 line) of photoresist applied to the wafer. The filter 121 is sometimes required to minimize the transmittivity of light of photoelectric detection wavelength so that any excess light does not reach the photodetecting system, but the filter 121 may be suitably selected in view of the filter 115. A polarizing plate 152 passes therethrough the S polarized light. In the observation system, reference numeral 122 denotes an erector for rotating the image in the normal direction, 123 a filter for attenuating the photoelectrically detected light, and in the example of FIG. 2, the light from the scanning laser, and 124 an eyepiece.

Operation will now be described. The laser beam is reflected by the rotatable polygonal mirror 13, and then enters the dichroic mirror 15. The dichroic mirror 15 has a sufficient transmittivity to the laser beam. Having passed through the dichroic mirror 15, the light travels to the polarizing beam splitter 17, which transmits therethrough the P polarized light. Therefore, the beam scans over the mask 112 through the objective lens 111. The beam further passes from the mask through the image forming optical system 140 and is reflected by the wafer 113 and again passes through the optical system 140 back to the objective lens, and the beam passes twice through the $\frac{1}{4}$ wavelength plate 141, so that the direction of polarization is rotated by 90° and the P polarized light becomes S polarized light. Therefore, the laser beam for photoelectric detection is reflected by the polarizing beam splitter 17 and directed to the system leading to the photoelectric detector 118. In the meantime, the factor for the attenuation of the laser beam can be almost eliminated. The normally reflected light of the spots 134, 134' is cut off by the filter 116 and does not reach the photoelectric element 118. Therefore, dark field-like photoelectric detection is carried out.

On the other hand, the observation optical system is as important as the photoelectric detecting system, because the observation optical system not only serves for observation of the pattern but also plays an important role in effecting necessary things such as incipient setting of the mask during the auto-alignment. The present device is therefore characterized in that the direction of polarization of the laser which is the light for photoelectric detection and the direction of polarization of the illuminating light for observation are orthogonal to each other at a point in time whereat they are incident on the mask.

Causing the direction of polarization of the illuminating light for observation to be orthogonal to the laser means is accomplished by setting the polarizing plate 152 in the system of FIG. 2 such that the S polarized light passes therethrough. Of the light of S polarization which has reached the mask 112, the reflected light on the mask surface which provides a flare light during observation to weaken the contrast of the entire system remains S polarized, and it is reflected by the polarizing beam splitter 17 and goes to the photoelectric detecting system side. However, this light differs in wavelength from the laser beam and therefore is prevented from reaching the photoelectric detector 118 by the filter 115.

Of the illuminating light for observation, the light other than the light reflected by the mask surface reaches the wafer 113 and is thereby reflected to come back, but the S polarization has changed to the P polarization due to the action of the $\frac{1}{4}$ wavelength plate by that time. Thus, after having passed back through the objective lens, the light is P polarized so that it passes through the polarizing beam splitter 17 and enters the dichroic beam splitter 15. The observation light is here reflected and enters the observation optical system. Therefore, the characteristic of the dichroic beam splitter 15 lies in that it passes the laser beam therethrough and reflects the observation light.

The device of FIG. 2 detects only the light from the wafer 113 by the photodetector 118 and therefore has an advantage that the interference noise of the scattered lights 5, 6, 7 (FIG. 1) is not superposed on the mask signal as in the device of U.S. Pat. No. 4,199,219. However, this device gives rise to another problem because it detects the light from the wafer 113.

That is, a wafer usually comprises a transparent photosensitive layer, usually is photoresist layer, formed on a reflective substrate. The thickness of this photosensitive layer usually differs depending on the place thereon. Therefore, in some places, the light having impinged on the photosensitive layer and the light reflected by the substrate sometimes create cancellation so that no reflected light can be obtained from the wafer. Therefore, illumination of the mask is effected by the reflected light from the wafer and accordingly, a mask signal is not obtained sometimes. To solve this problem, the device of U.S. Pat. No. 4,251,129 shown in FIG. 4 detects the light directly reflected from the mask 12 separately.

This device will hereinafter be described with reference to FIG. 4. The great difference of the FIG. 4 device from the FIG. 2 device lies in that a half-mirror 170 is used instead of the polarizing beam splitter 17 of FIG. 2 and a polarizing beam splitter 160 is used in the subsequent light path. This polarizing beam splitter 160 separates the direct reflected light from the mask 112 and the light twice passed through the λ/4 plate 141. The separated lights, as in the device of FIG. 2, pass through filters 116 which passes therethrough only the scattered light, and are detected by photodetectors 118. The outputs of the photodetector 118 are overlapped by an OR circuit 153. Accordingly, even if the cancellation of the light having impinged on the wafer caused by the photosensitive layer of the wafer 113 results, a mask signal will be directly obtained from the reflected light.

Thus, the device of FIG. 4 is very effective, but said application does not disclose that the mask can be observed in the light view field and that a photoelectric detecting system is disposed in the illuminating system for visual observation.

SUMMARY OF THE INVENTION

It is an object of the present invention to provide a photoelectric detecting device which enables the mask to be observed in the light view field.

It is another object of the present invention to provide a photoelectric detecting device which has a photoelectric detecting system disposed in the illuminating system for visual observation.

The invention will become fully apparent from the following detailed description thereof taken in conjunction with the accompanying drawings.

BRIEF DESCRIPTION OF THE DRAWINGS

FIG. 1 illustrates the superposition of interference noise upon a mask signal.

FIG. 2 shows the optical arrangement of the photoelectric detecting device according to the prior art.

FIGS. 3a and 3b illustrate the regular reflected light and scattered light of the pupil plane of the objective lens of the FIG. 2 device.

FIG. 4 shows the optical arrangement of a photoelectric detecting device improved over the FIG. 2 device.

FIG. 7 shows the three-dimensional arrangement of the FIG. 6 device.

FIG. 8 shows an example of the signal processing system.

DESCRIPTION OF THE PREFERRED EMBODIMENTS

Figure 5:
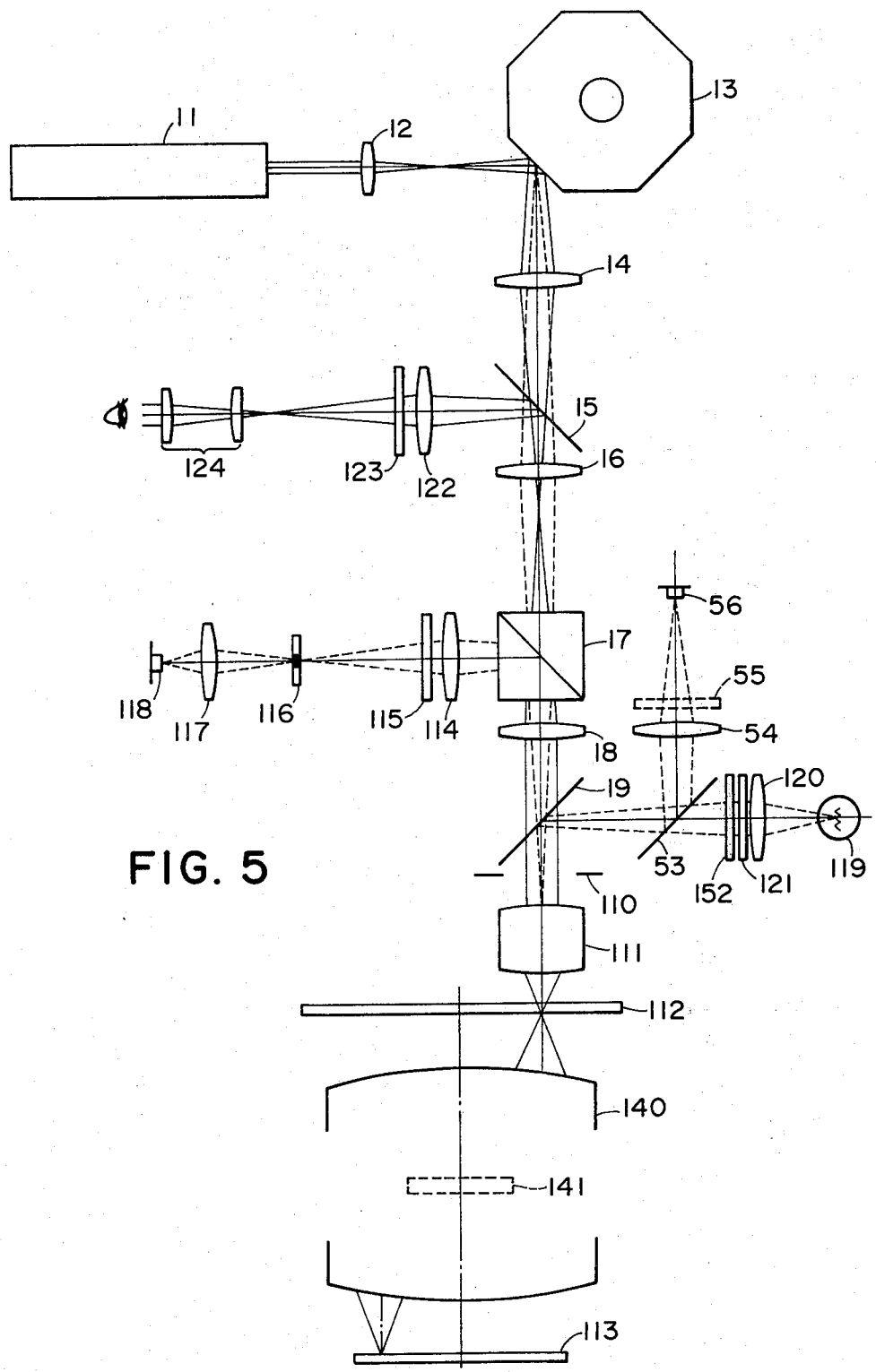
FIG. 5 shows the optical arrangement of the photoelectric detecting device according to the present invention.

The device of FIG. 5 is similar to the device of FIG. 4 with the exception that instead of the half-mirror 170 of FIG. 4, a polarizing beam splitter 17 is used to detect the light twice passed through the λ/4 plate 141 and that a photoelectric detecting system 53, 54, 55, 56 is inserted in the illuminating system 119, 120, 121, 152 for visual observation. The other parts are similar to those of FIG. 4 and therefore need not be described.

The light separated by the polarizing beam splitter 17 and twice passed through the λ/4 plate passes through optical elements 114, 115, 116, 117 and travels toward a detector 118. A filter 116 passes therethrough only the component of light scattered by the patterns of the mask 112 and the wafer 113. Accordingly, the alignment marks of the mask and wafer are read in the dark view field by the photodetector 118. A half-mirror 53 disposed in the illuminating system directs both the light directly reflected from the mask 112 and the light reflected from the wafer 113 toward a photodetector 56. An analyzer 55 directs only the light reflected from the mask 112 toward the detector 56. When the light reflected from the mask 112 and the light reflected from the wafer 113 greatly differ in level of quantity of light, the analyzer 55 need not be used. However, when the light reflected from the mask 112 and the light reflected from the wafer 113 are at the same level, the use of the analyzer 55 improves the signal to noise ratio to a great extent. When the reflected light from the mask is thus detected by the detector 56, the outputs of the detectors 56 and 118 are processed by the electric circuit of FIG. 8.

FIG. 8 shows an example in which the outputs of the detectors 118 and 56 are amplified by preamplifiers 60 and 61 and thereafter are added to each other by an OR circuit 62 and enter a pulse interval measuring circuit 63 and so on. Besides this, various modifications are conceivable such as first effecting the waveform shaping of signals and then adding them to each other.

Figure 6:
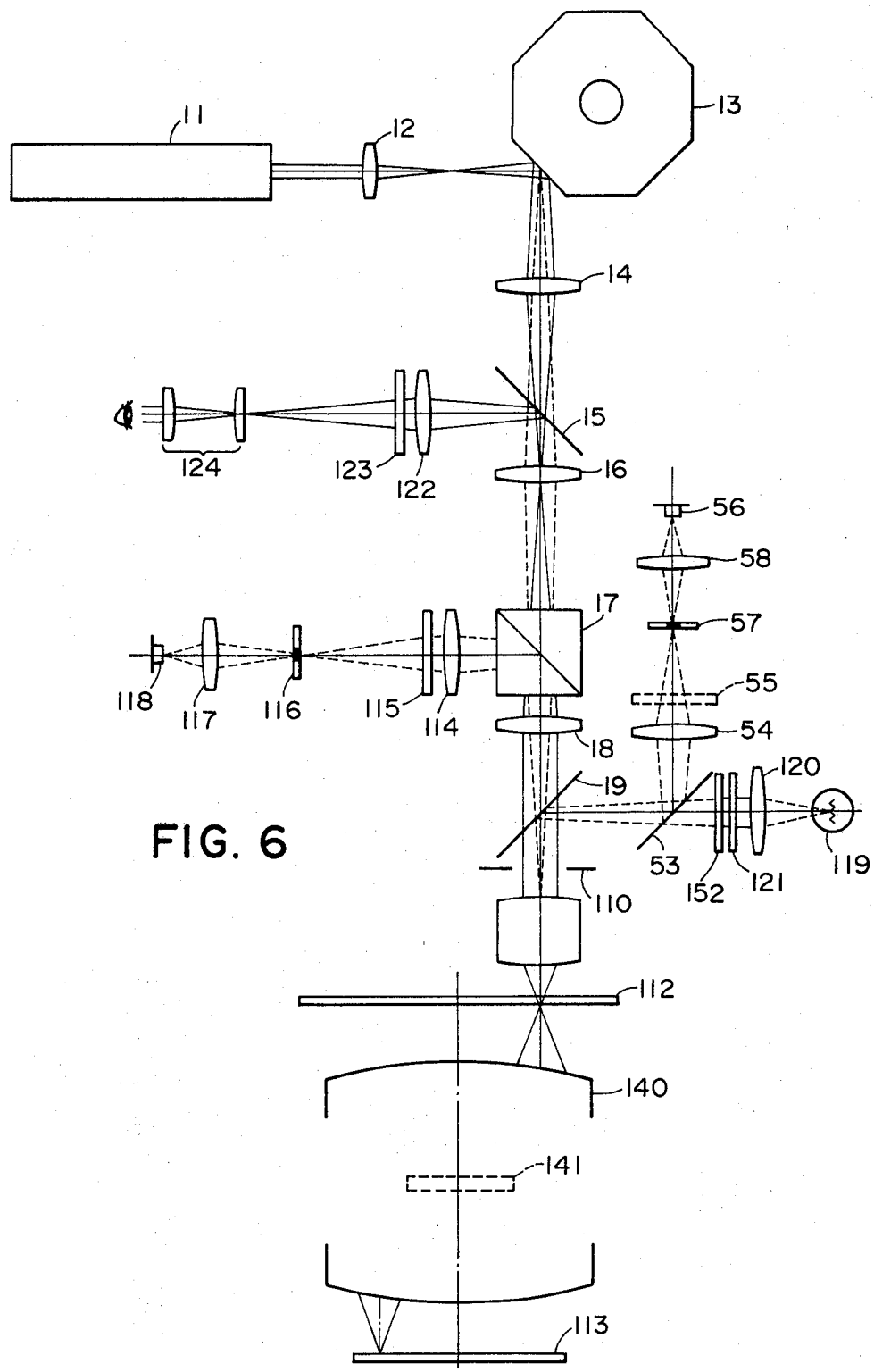
FIG. 6 shows the optical arrangement of a second embodiment of the present invention.

FIG. 7 shows an embodiment in which the optical system of FIG. 6 is illustrated in three dimensions.

The position adjustment of the mask and wafer is usually carried out by observing a plurality of places on the mask and wafer because all the degree of two-dimensional freedom must be covered. FIG. 7 is an example of an arrangement in which two places are observed and detected, and a roof type mirror 125 performs the function of dividing the scanning laser light into two light paths. The edge of the reflective roof portion of the mirror 125 is set so as to intersect the optic axis, and further, that edge or the vicinity thereof provides a primary imaging surface of the mask formed by an objective lens 111 and a relay lens 18. That is, the edge of the roof acts as the line dividing the view field when observation is effected through an eyepiece. The numbers in FIG. 7 correspond to the numbers in FIG. 6, but unnumbered parts represent mirrors or prisms used to bend the light path. The pupil 110 of the objective lens is depicted as a diaphragm in FIG. 6 for convenience of illustration, but the effective diameter of the pupil 110 is necessarily determined by the effective diameter of the objective lens, etc, and therefore, any mechanical diaphragm is not particularly necessary.

The system of FIG. 6 is one which reads the mask signal in the dark view field. Therefore, a filter 57 for passing therethrough only the scattered light and a lens 58 for directing the light passed through the filter 57 toward the detector 56 are further added to the system of FIG. 5.

In FIG. 7, the beam splitter 53 can act as polarization beam splitter, i.e., the beam splitter 53 in FIG. 7 has the functions of both the splitter 53 and the analyzer 55 in FIG. 6.

The advantage of the insertion of the photoelectric detection system in the illumination system in accordance with the present invention is as follows. In general, the mask signal has a high signal to noise ratio because the edges of the alignment mark are formed on the glass substrate of the mask clearly and because the reflectivity of the glass and that of chrome differ greatly. However, the wafer signal varies in accordance with the wafer structure. Therefore, it sometimes occurs that a poor wafer signal is detected. Thus, it is desirable to obtain the wafer signal with as high efficiency as possible. The polarization beam splitter 17 and λ/4 plate assume this role. In contradistinction, it is not necessary to obtain the mask signal with high efficiency, because the mask signal as noted has a high signal to noise ratio. The insertion of the photoelectric system for obtaining the mask signal in the illumination system provides this effect. Only a small part of the beam enters the photoelectric detecting system including photodetector 56, but this is sufficient for adequate detection of the mask signal.

While the foregoing description has been made with the optical system restricted to a lens, the present invention may also use a mirror imaging system or an imaging system comprising a combination of a mirror and a lens. Also, a λ/4 plate has been used as the means for varying the polarized condition, but particularly in an optical system having a mirror, a phase difference mirror for providing a phase difference may be used to obtain the same result. Further, the present invention has been described with respect to a case where the alignment marks of the mask and wafer are read, but it is also applicable to a system for reading other patterns.

What I claim is:

1. A photoelectric detecting apparatus for reading a pattern on a first sheet-like object and a pattern on a second sheet-like object, comprising:

a light source projecting a polarized light beam therefrom;

a scanning optical system for scanning the light beam on said first sheet-like object;

an imaging system for forming the image of said first sheet-like object on said second sheet-like object with the scanning light beam;

means disposed between said first sheet-like object and said second sheet-like object for varying the polarized condition of the scanning beam;

first photoelectric means for receiving and detecting the reflected light from one of said sheet-like objects;

second photoelectric means for receiving and detecting the reflected light from the other of said sheet-like objects;

a polarization beam splitter disposed between said light source and first sheet-like object for directing said scanning light to said first sheet-like object and for directing the light reflected from said second sheet-like object to said first photoelectric means;

a beam splitter disposed between said light source and said first sheet-like object for directing said scanning light to said first sheet-like object and for directing the light reflected therefrom to said second photoelectric means; and polarization means disposed between said first sheet-like object and said second photoelectric means, for directing only the light from the first sheet-like object to said second photoelectric means.

2. A photoelectric detecting apparatus as claimed in claim 1 wherein said first photoelectric means detects the reflected light in the dark field.

3. A photoelectric detecting apparatus as claimed in claim 1 wherein said second photoelectric means detects the reflected light in the bright field.

* * * * *